United States Patent
Mongia et al.

(10) Patent No.: US 7,269,008 B2
(45) Date of Patent: Sep. 11, 2007

(54) COOLING APPARATUS AND METHOD

(75) Inventors: Rajiv K. Mongia, Portland, OR (US); Stephen W. Montgomery, Seattle, WA (US); Willem M. Beltman, West Linn, OR (US); Mark A. Trautman, Aloha, OR (US); Nels E. Jewell-Larsen, Seattle, WA (US)

(73) Assignee: Intel Corporation, Santa Clara, CA (US)

( * ) Notice: Subject to any disclaimer, the term of this patent is extended or adjusted under 35 U.S.C. 154(b) by 184 days.

(21) Appl. No.: 11/171,682

(22) Filed: Jun. 29, 2005

(65) Prior Publication Data
US 2007/0002534 A1    Jan. 4, 2007

(51) Int. Cl.
*H05K 7/20* (2006.01)
(52) U.S. Cl. ............... 361/689; 361/687; 361/695; 361/697; 165/96; 165/109.1; 165/121; 315/111.91
(58) Field of Classification Search ............... 361/679, 361/687, 692–697, 700, 719, 230, 231, 232; 165/121–126, 80.3, 96, 109.1; 174/15.2, 174/16.1, 16.3; 95/2–8, 79–81; 96/18–26, 96/80–82; 315/506, 111.31, 111.91, 111.21, 315/111; 417/50
See application file for complete search history.

(56) References Cited

U.S. PATENT DOCUMENTS

| | | | |
|---|---|---|---|
| 4,210,847 A * | 7/1980 | Shannon et al. ........ 315/111.91 |
| 5,758,823 A | 6/1998 | Glezer et al. |
| 5,769,155 A * | 6/1998 | Ohadi et al. ............. 165/109.1 |
| 5,894,990 A | 4/1999 | Glezer et al. |
| 5,957,413 A | 9/1999 | Glezer et al. |
| 5,982,102 A * | 11/1999 | Andrzej ................. 315/111.91 |
| 6,522,536 B2 * | 2/2003 | Brewer et al. ............. 361/687 |
| 6,628,522 B2 | 9/2003 | Trautman et al. |
| 6,891,724 B2 | 5/2005 | De Lorenzo et al. |
| 6,921,462 B2 | 7/2005 | Montgomery et al. |
| 7,113,402 B2 * | 9/2006 | Rutledge et al. ........... 361/695 |
| 7,122,070 B1 * | 10/2006 | Krichtafovitch ................. 95/2 |
| 2003/0117770 A1 | 6/2003 | Montgomery et al. |
| 2003/0231471 A1 | 12/2003 | De Lorenzo et al. |

(Continued)

FOREIGN PATENT DOCUMENTS

JP      10241556 A  *  9/1998

OTHER PUBLICATIONS

The Article: "Electrostatic Cooling of Electronic Packages", IBM Technical Disclosure Bulletin, Jun. 1975, US vol. 18, Issue 1, pp. 101-102.*

(Continued)

*Primary Examiner*—Michael Datskovskiy
(74) *Attorney, Agent, or Firm*—Schwabe, Williamson & Wyatt, P.C.

(57) ABSTRACT

A cooling apparatus is provided with an electrostatic flow modifier to be complementarily positioned relative to a cooling fluid flow to modify at least one characteristic of the cooling fluid flow to enhance an amount of heat the cooling fluid flow removes from an electronic component.

17 Claims, 5 Drawing Sheets

U.S. PATENT DOCUMENTS

2004/0184241 A1   9/2004   De Lorenzo et al.
2004/0266063 A1   12/2004  Montgomery et al.
2005/0139345 A1   6/2005   Pokhama et al.
2005/0217278 A1   10/2005  Mongia et al.
2006/0005946 A1*  1/2006   Borgstrom et al. ........... 165/96
2006/0169441 A1*  8/2006   Schlitz ....................... 165/121

OTHER PUBLICATIONS

F. Yang et al., "Corona driven air propulsion for cooling of electronics," XIIIth International Symposium on High Voltage Engineering, Netherlands 2003, Smit (ed.), ISBN 90-77017-79-8, pp. 1-4.

* cited by examiner

COOLING APPARATUS AND METHOD

TECHNICAL FIELD

Embodiments of the present invention relate generally to arrangements to cool electronics, and more particularly to an apparatus system and method to manipulate cooling fluid flow to make heat transfer more effective.

BACKGROUND

Increasing levels of component power and power density from electronic devices such as integrated circuits and memory are creating an increased demand for airflow in thermal management solutions. This results in high acoustic noise levels in computer platforms. A need for more efficient cooling exists to expand the thermal dissipation performance envelope. Bulk or mean airflow may be required to cool electronic devices or finned surfaces attached to the devices. For example cooling air may be blown onto or passed across a memory device or onto or passed across a heat sink, or thermal transfer plate, heat pipe condenser or the like to cool them.

The airflow across a flat plate or across heat sink fins generates a boundary layer. The airflow velocity is zero at the surface and increases to the mean stream velocity outside the boundary layer. The rate of heat transfer from an object to a cooling fluid flow depends on a number of parameters including characteristics of the flow particularly at the boundary layer, including but not limited to velocity, velocity profile including the velocity gradient, level of turbulence, vorticity, flow movement, and mixing.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF ILLUSTRATIVE EMBODIMENTS OF THE INVENTION

Figure 1:
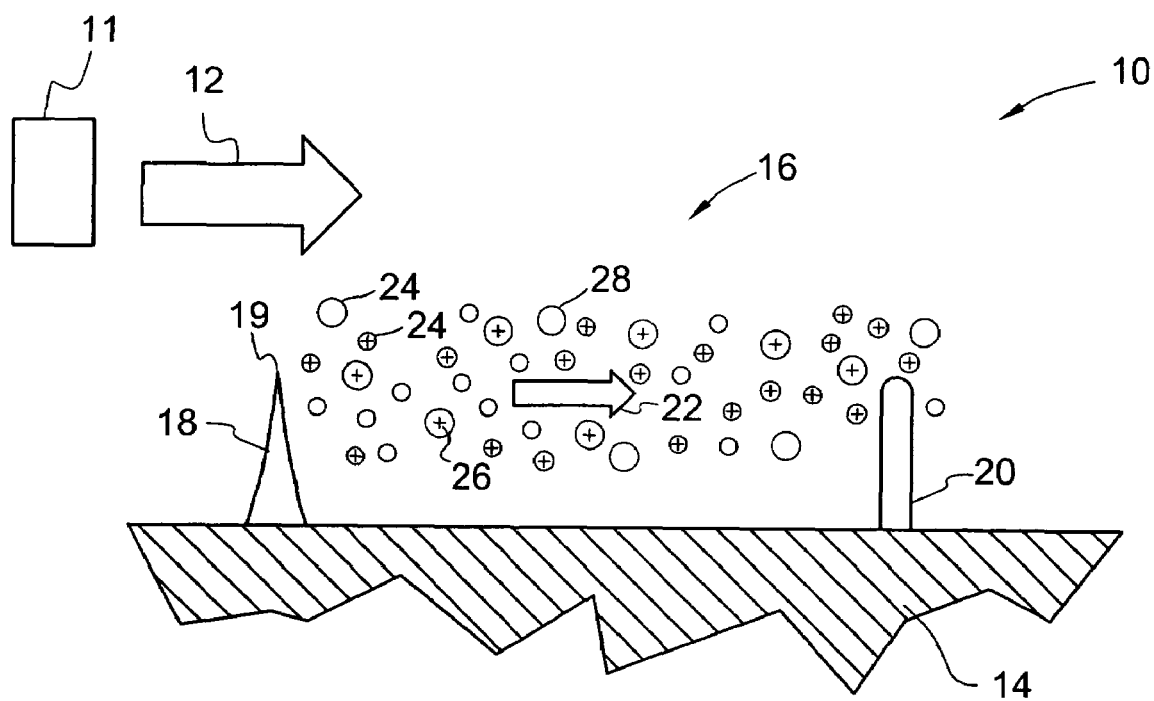
FIG. 1 is a conceptual illustration of one embodiment of the present invention.

Embodiments of the invention may use localized configurations of corona air propulsion micro-jets, or ionic propulsion micro-jets, to improve the heat transfer from a device surface in the presence of an embedding mean flow. Embodiments may use corona micro-jets to perturb and enhance the airflow around a surface, resulting in increased heat transfer and consequently less overall acoustic noise. Embodiments may use an ionizer, a charge repeller and a charge attractor in order to modify a cooling fluid flow.

Embodiments may manipulate the mean flow in discrete locals creating enhanced micro flows bringing cool air toward a surface and removing hot air from a surface. Embodiments may manipulate the flow of cooling air especially at boundary layers perturbing, and disrupting, the flow and enhancing the heat transfer from an object to be cooled to the cooling fluid. Embodiments may make flow more turbulent at the boundary layer. Embodiments of the present invention may be designed to impart momentum to the fluid flow to at least partially compensate for friction losses in the fluid flow across the surface including maintaining a consistent fluid profile along the length of a surface such as a cooling fin.

Embodiments may provide an electrostatic flow modifier to modify the characteristics of a cooling flow including but not limited to: a fluid velocity profile of the cooling fluid flow; a fluid velocity gradient of the cooling fluid flow; a fluid velocity adjacent the electronic component; a level of turbulence in the cooling fluid flow; a level of mixing of the cooling fluid flow; a flow direction of at least a part of the cooling fluid flow; a presence of vortices in at least a part of the cooling fluid flow; a compression level of a boundary layer of the cooling fluid flow; and a momentum of at least a part of the cooling fluid flow.

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made in alternate embodiments. Therefore, the following detailed description is not to be taken in a limiting sense, and the scope of embodiments in accordance with the present invention is defined by the appended claims and their equivalents.

The following description may include terms such as inner, outer, under, between, upward, downward, outward, inward, top, bottom, above, below and the like. Such terms are used for descriptive purposes only and are not to be construed as limiting in the description or in the appended claims. That is, these terms are terms that are relative only to a point of reference and are not meant to be interpreted as limitations but are, instead, included in the following description to facilitate understanding of the various aspects of the invention.

The phrase "in one embodiment" is used repeatedly. The phrase generally does not refer to the same embodiment, however, it may. The terms "comprising", "having", and "including" are synonymous, unless the context dictates otherwise.

FIG. 1 is a conceptual illustration of one embodiment of the invention. A cooling apparatus 10 may have a cooling flow provider 11 to provide a cooling fluid flow 12 to cool an object which may be an electronic component 14 such as, but not limited to, an integrated circuit, a memory module, a Micro-Electro-Mechanical System (MEM), a sensor, a resister, or a capacitor. The cooling apparatus 10 may be positioned directly on the electronic component 14, or on a thermal solution including, but not limited to, a heat sink including heat sink fins, a heat pipe, a heat spreader, a heater block, a thermal transfer plate, and a vapor chamber. An electrostatic flow modifier 16 may be complementarily positioned relative to the cooling fluid flow provider 11 or the electronic component 14, or both, to modify at least one characteristic of the cooling fluid flow 12 to enhance an amount of heat the cooling fluid flow 12 removes from the electronic component 14. The exact complementary positioning is application dependent, and may include a number of factors, including but are not limited to the amount of heat to be removed, the volume and velocity of the air flow, the number and nature of the characteristics of the air flow being modified, and so forth. The optimal complementary positioning for a particular application of flow provider and flow modifier may be determined empirically.

The electrostatic flow modifier 16 may include a charge source such as a charge emitter, or a fluid ionizer, or a charge injector, and may be a corona electrode 18 as illustrated in this example embodiment, and a charge attractor such as a receiver electrode 20. The corona electrode 18 may come to a sharp point 19 wherein a high intensity electric field, or a charge will collect and may ionize particles in the fluid flow 12. A modified flow 22 is represented by an arrow and a plurality of circles 24, some of which have received an electrical charge 26 as represented with a positive charge. (Most of the fluid flow 12 is not illustrated with circles but may be present.) The particles may instead be negatively charged. Positive is indicated here for illustration. The charged particles 26 may be repelled from the corona electrode 18 and attracted to the receiver electrode 20. An entrained flow may also exist and be carried with the charged particles as represented by the circles 28 without charges. In this and other embodiments, elements to provide or receive charge may be appropriately coupled to a charge source such as power source by, including but not limited to, wires or traces, on surfaces or embedded within objects such as electronic components, and thermal solutions, to be cooled.

In the case of the cooling fluid being a gas such as air, a so called electron avalanche may occur wherein: collisions of electrons and neutral gas molecules in an ionization region result in electrons breaking free of the neutral air molecules, creating free electrons and positive ions which in turn are accelerated by Coulomb forces and produce more pairs of free electrons and positive ions.

Figure 2:
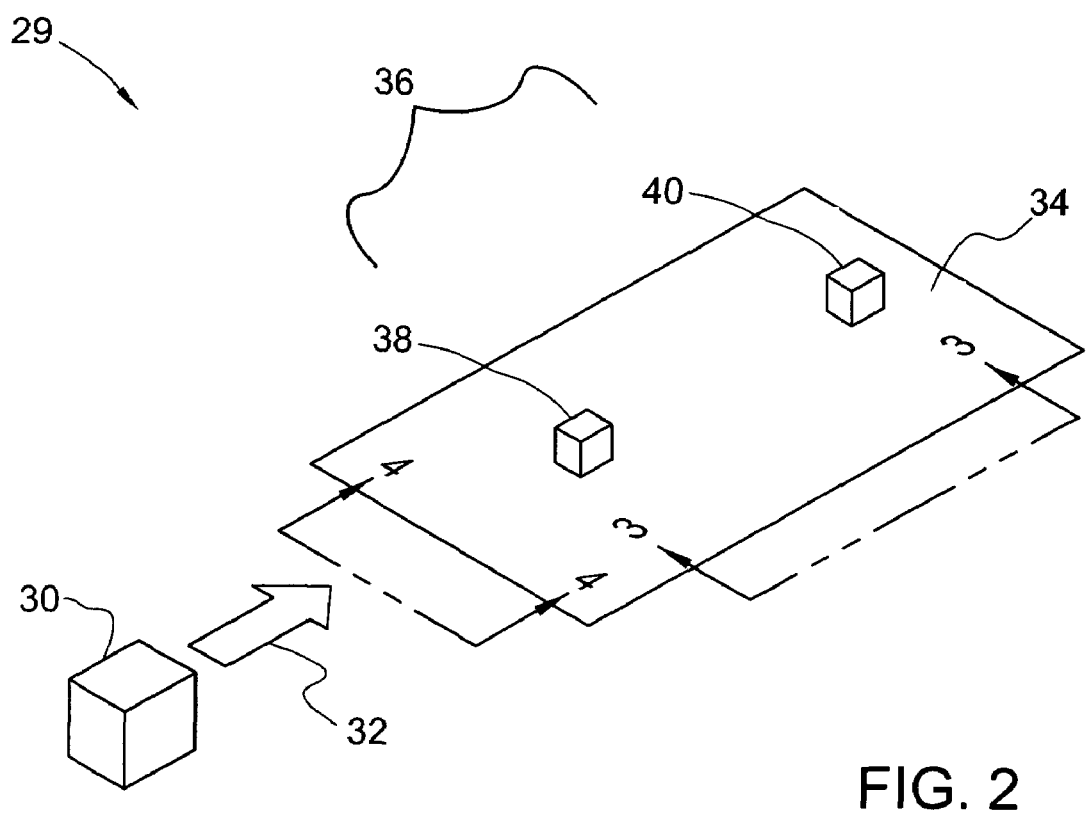
FIG. 2 is a schematic representation of one embodiment of the present invention.

FIG. 2 is a schematic representation of one embodiment of the invention. A cooling apparatus 29 includes a cooling flow provider 30, represented here by a box which may include a fan or a source of compressed air, or the like, provides a cooling fluid flow 32 across a surface 34 which may be on, or directly or indirectly in thermal contact with an electronic component or other object for which thermal management may be desired. An electrostatic flow modifier 36 is illustrated with a charge source 38 or, upstream electrode (represented by a box) and a downstream, or charge attracter 40, or receiver electrode (also represented by a box). For the embodiment, charge source 38 is about ⅓ into surface 34 along the direction of flow, and charge attracter 40 is about another ⅓ further into surface 34 along the direction of flow. In alternate embodiments, for other applications, including employment of other flow providers and/or other flow modifiers, the complementary positioning may be different. In one embodiment a portion of a thermal solution, for example, one or more fins, of a heat sink may be kept at a specified electric potential, for example grounded, and may be a receiver electrode.

Figure 3:
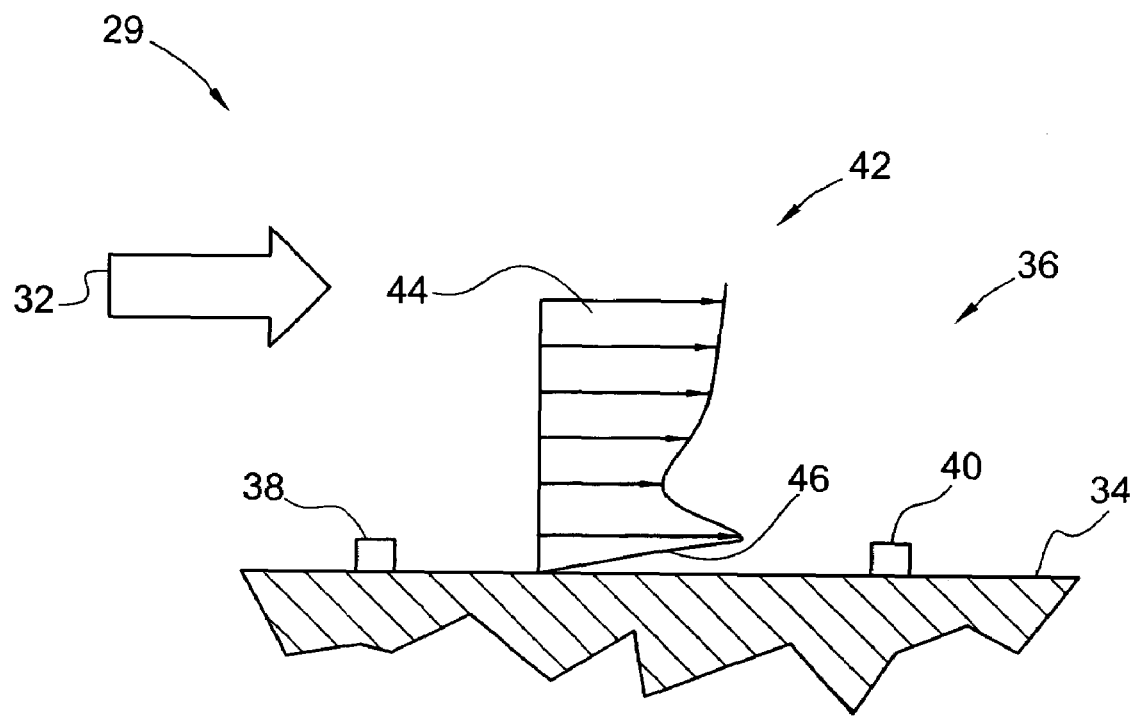
FIG. 3 is a side view partially in section taken from the direction 3-3 in FIG. 2 illustrating one embodiment of the present invention.

FIG. 3 is a side view partially in section taken from the direction 3-3 in FIG. 2 illustrating one embodiment of the invention. A cooling apparatus 29 may include a charge source 38, for example a corona electrode, and a charge attracter 40, for example a receiver electrode on a surface 34 to be cooled. A portion of a modified flow 42 is illustrated as a fluid velocity profile 44. The fluid velocity profile 44 includes a modified velocity gradient 46 wherein the electrostatic flow modifier 36 has increased the velocity of the fluid flow adjacent to the surface 34, to enhance an amount of heat the cooling fluid flow 32 may remove from the surface 34. Embodiments of the invention may include an electrostatic flow modifier 36 designed to perturb, or disrupt, the cooling fluid flow 32, or to make parts of the cooling fluid flow 32 more turbulent. The electrostatic flow modifier may also be designed to impart momentum to the fluid flow to at least partially compensate for friction losses in the fluid flow across the surface 34.

Figure 4:
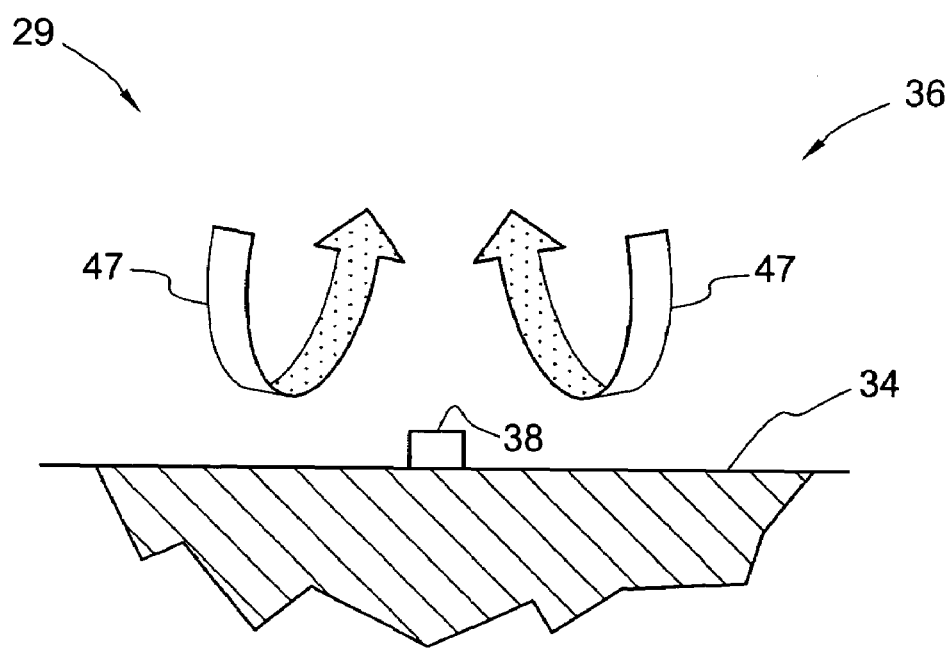
FIG. 4 is a front side view partially in section taken from the direction 4-4 in FIG. 2 illustrating one embodiment of the present invention.

FIG. 4 is a front side view partially in section taken from the direction 4-4 in FIG. 2 illustrating one embodiment of the invention. A cooling apparatus 29 may include an upstream electrode, or charge source 38, on a surface 34. A vortex pair 47 is illustrated with two arrows. (Dots have been included on a portion of the arrows for diagrammatic clarity.) The presence of the electrostatic flow modifier 36 may create a disturbance transverse to the cooling fluid flow 32 direction. This may generate counter-rotating pairs of vortexes 47 generally in the direction of the cooling fluid flow 32. The vortexes 47 may impinge relatively cooler fluid from above the surface 34 and pump it down to the surface 34, enhancing an amount of heat the coolant fluid may remove from the surface 34.

Figure 5:
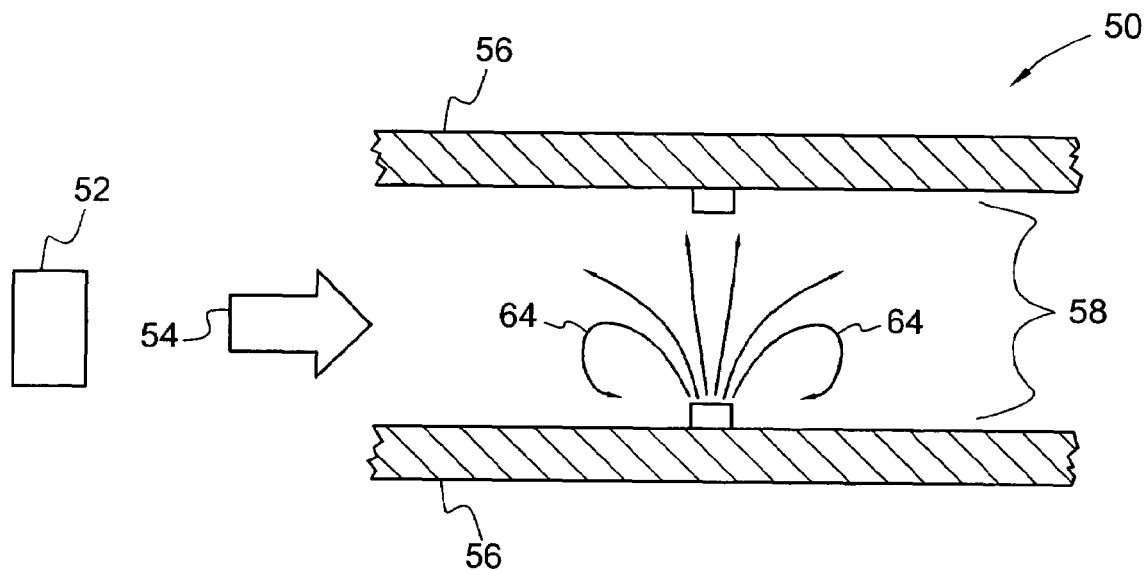
FIG. 5 is a cross-sectional view of one embodiment of the present invention.

FIG. 5 is a cross-sectional view of one embodiment of the invention. A cooling apparatus 50 may include a cooling fluid flow provider 52 to provide a cooling fluid flow 54 to flow across and between at least one pair (as illustrated here) of fins 56 of a thermal solution such as a heat sink. The thermal solution may be in thermal transfer contact with, for example, an electronic component. An electrostatic flow modifier 58 is designed to move some of the cooling fluid transverse to the direction of the fluid steam. A charge source is positioned near, on, or attached to one fin 56 (approximately ½ way into the channel along the direction of flow), and a charge attracter is positioned near, on or across the channel, attached to another fin 56. The impinging flow created by the electrostatic flow modifier 58 may compress the boundary layer on one fin, and may create a pattern of streamwise or rolling vortexes 64 across the direction of the cooling fluid flow 54. The vortexes 64 may transport warm air away from the surface and impinge cold air on the surface to improve the heat transfer. As with earlier described embodiments, in alternate embodiments, for other applications, including employment of other flow providers and/or other flow modifiers, the complementary positioning may be different.

In one embodiment the lower surface 56 can be a spreader, vapor chamber, or other component and the upper surface 56 can be the upper or lower skin of the notebook. One embodiment of the invention includes a cooling apparatus for at least a pair of electronic components, for example pair(s) of memory modules. One embodiment of the invention may not place the respective electrode pairs opposite one another but instead place one upstream from another.

Figure 6:
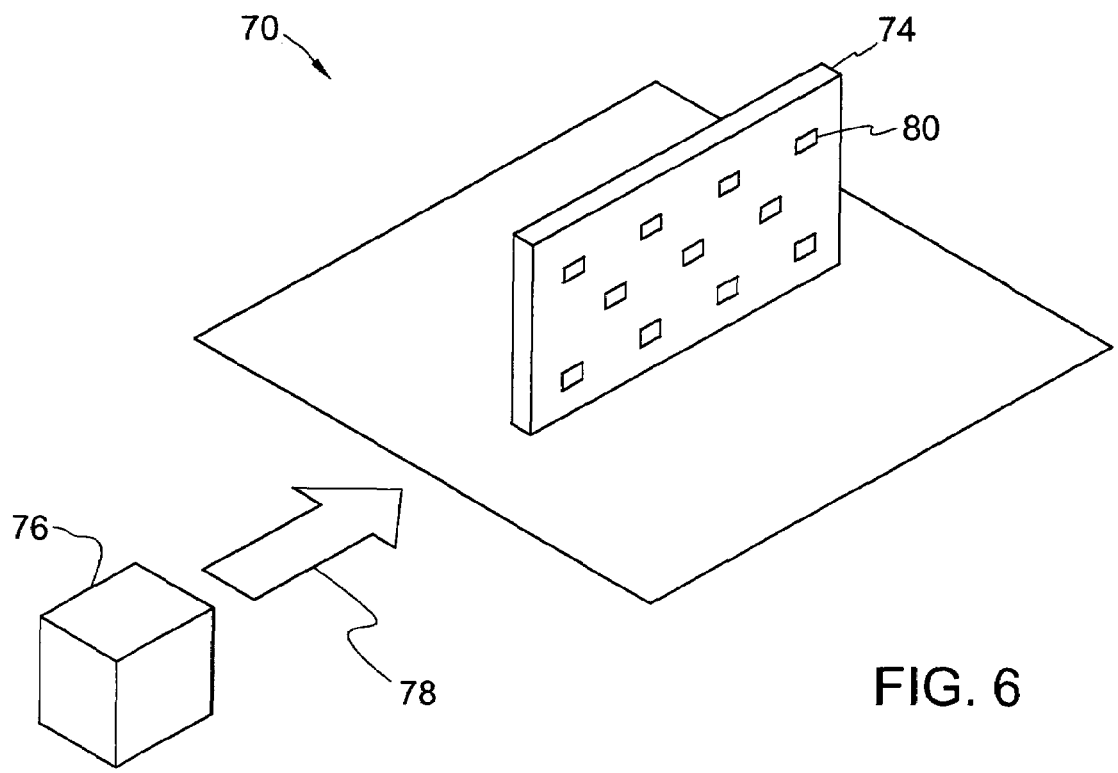
FIG. 6 is a perspective view illustrating one embodiment of the present invention.

FIG. 6 is a perspective view illustrating one embodiment of the invention. A single element 74 which may represent a single fin, of a heat sink, which may or may not be connected to, or adjacent to, other fins, or an electronic component like a memory module. The element 74 may also represent any number of surfaces which may require cooling, including but not limited to heat sinks, heat pipes, heat spreaders, heater blocks, thermal transfer plates and vapor chambers. A cooling flow provider 76 is designed to provide a cooling fluid flow 78 to the element 74. A plurality of electrostatic flow modifiers 80 represented in FIG. 6 by rectangles are positioned on the element 74 and arranged in offset rows/columns. The electrostatic flow modifiers 80 may be designed to provide local flow enhancement near the surface of the element on a micro level, and perturb the global flow field, and provide enhanced mixing on a macro level, and enhance an amount of heat the cooling fluid flow may remove from the element 74. They may also be designed to add momentum to the flow and to modify a flow velocity gradient that may otherwise increase along the length of an element. As with earlier described embodiments, in alternate embodiments, for other applications, including employment of other flow providers and/or other flow modifiers, the complementary positioning may be different.

Figure 7:
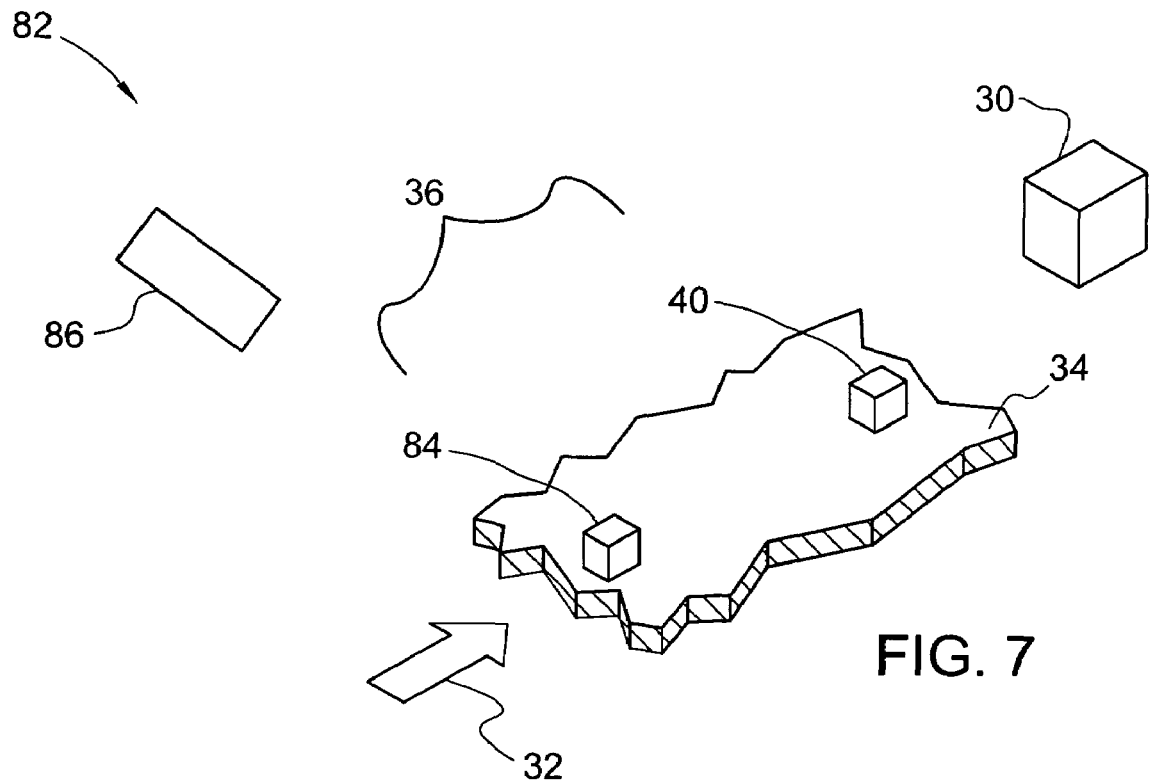
FIG. 7 is a schematic representation of one embodiment of the present invention.

FIG. 7 is a schematic representation of one embodiment of the invention. For the embodiment, a cooling apparatus 82 includes a cooling flow provider 30, represented here by a box which may include a fan or a source of compressed air, or the like, to provide a cooling fluid flow 32 across a surface 34. The cooling flow provider is located downstream from the surface 34 which may be the case in some applications including, but not limited to, evacuated enclosures, which may include notebook computers. The surface 34 which may be on, or directly or indirectly in thermal contact with, an electronic component or other object for which thermal management may be desired. An electrostatic flow modifier 36 is illustrated with a charge repeller 84, and a charge attracter 40, or receiver electrode (also represented by a box). An ionizer 86 is directed at the cooling fluid flow 32 to ionize particles in the flow 32 which may be repelled by the charge repeller 84 and attracted by the charge attractor 40. The ions may be positively charged or negatively charged. Ionization may be caused to occur by any appropriate ionizer. In one embodiment, it may be caused to occur by photo-ionization which may include exciting particles in the cooling fluid stream 32 with electromagnetic radiation, which may be from a visible or invisible portion of the electromagnetic spectrum, including X-rays. In one embodiment, a LASER is used to ionize particles in the cooling fluid stream 32. In one embodiment different portions of a thermal solution, for example, different fins may be kept at different electric potentials and may modify a cooling fluid flow 32.

Figure 8:
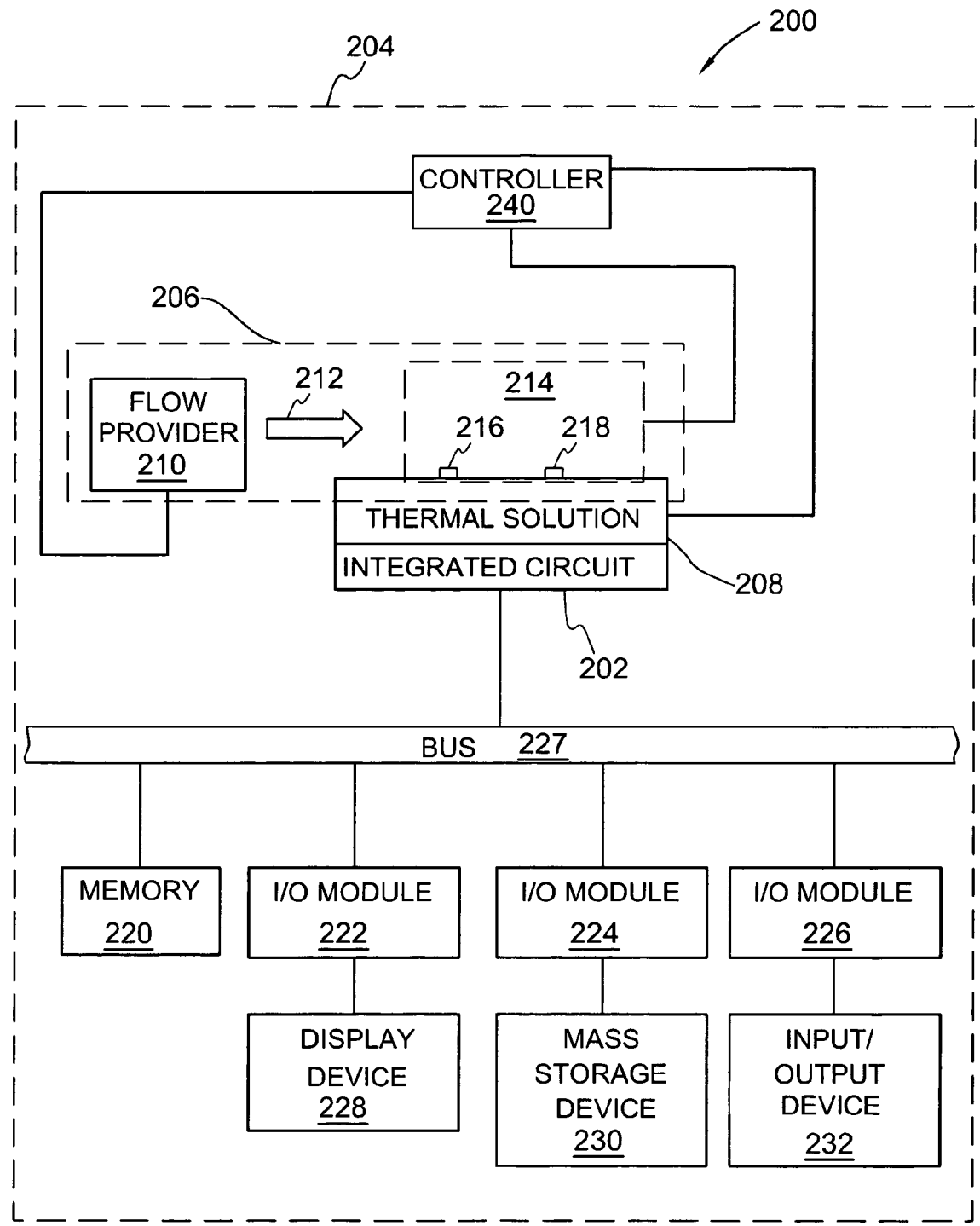
FIG. 8 illustrates a block diagram of a system according to one embodiment of the present invention.

FIG. 8 illustrates a block diagram of a system 200 according to one embodiment of the invention, which is just one of many possible systems in which one or more of the earlier described cooling apparatus embodiments may be used. In this illustrated system 200, an electrical component may be an integrated circuit 202 which may be a processor. The integrated circuit 202 may be directly coupled to a printed circuit board (PCB) 204, represented here in dashed line, or indirectly coupled by way of a socket (not shown). The PCB 204 may be a motherboard. A cooling apparatus 206 may be in thermal transfer contact with the integrated circuit 202 directly or via a thermal solution 208 as illustrated here. The cooling apparatus 206 may be one of the earlier described cooling apparatus embodiments.

The cooling apparatus 206 may include a cooling fluid flow provider 210 configured to provide a cooling fluid flow 212 to cool the integrated circuit 202. An electrostatic flow modifier 214 may be complementarily positioned relative to the cooling fluid flow provider 210 or the integrated circuit 202, or both, to modify at least one characteristic of the cooling fluid flow 212 to enhance an amount of heat the cooling fluid flow 212 removes from the integrated circuit 202. The electrostatic flow modifier 214 may include a charge source such as a discharge electrode 216, or such as a corona electrode, and a charge attracter, such as a receiver electrode 218.

Additionally, system 200 may include a main memory 220 and one or more, for example three, input/output (I/O) modules 222, 224 and 226. These elements including the earlier described integrated circuit 202 may be coupled to each other via bus 227. The system 200 may further include a display device 228, a mass storage device 230 and an input/output (I/O) device 232 coupled to the bus 227 via respective input/output (I/O) modules 222, 224, and 226. Examples of the memory include, but are not limited to, static random access memory (SRAM) and dynamic random access memory (DRAM). The memory may also include cache memory. Examples of the display device may include, but are not limited to, a liquid crystal display (LCD), cathode ray tube (CRT), light-emitting diode (LED), gas plasma, or other image projection technology. Examples of the mass storage device include, but are not limited to, a hard disk drive, a compact disk (CD) drive, a digital versatile disk (DVD) drive, a floppy diskette, a tape system, and so forth. Examples of the input/output devices may include, but are not limited to, devices which may be suitable for communication with a computer user, for example a keyboard, a mouse, a microphone, a voice recognition device, a display, a printer, speakers, and a scanner. The system may be included within, or include, a cell phone or a personal digital assistant (PDA).

Various embodiments of the invention can also be used to thermally manage other components, for example, a memory module, or discrete components such as capacitors or resistors and the like.

The system 200 may further include a controller 240 coupled to the integrated circuit 202 to accept a temperature state from the integrated circuit, and coupled to the cooling fluid flow provider 210 and the electrostatic flow modifier 214. The controller may be designed to effect a change in one or both of the cooling fluid flow 212 from the cooling fluid flow provider 210 and a charge level from the electrostatic flow modifier 214 based on the temperature state.

The system may include the electrostatic flow modifier 214 positioned on or adjacent to a surface to be cooled to impart momentum to the cooling fluid flow and increase a fluid velocity gradient.

Figure 9:
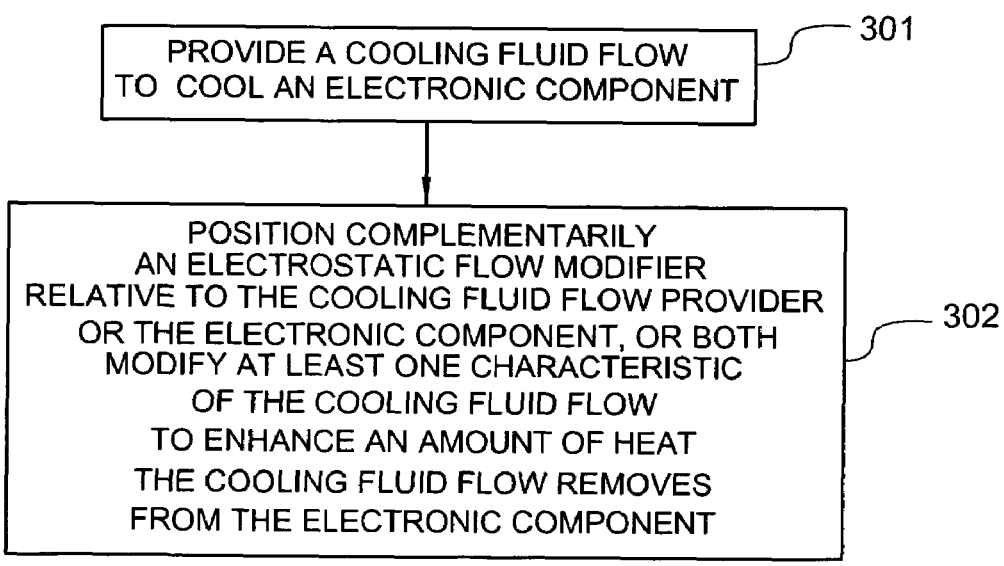
FIG. 9 is a flow diagram illustrating a method in accordance with one embodiment of the present invention.

FIG. 9 is a flow diagram illustrating a method in accordance with one embodiment of the invention. The method includes:

providing a cooling fluid flow to cool an electronic component, 301; and positioning complementarily an electrostatic flow modifier relative to the cooling fluid flow provider or the electronic component, or both, to modify at least one characteristic of the cooling fluid flow to enhance an amount of heat the cooling fluid flow removes from the electronic component, 302.

One embodiment of the invention may include modifying at least one characteristic of the cooling fluid flow including, but not limited to: modifying a fluid velocity profile of the cooling fluid flow; modifying a fluid velocity gradient of the cooling fluid flow; modifying a fluid velocity adjacent the electronic component; modifying a level of turbulence of the cooling fluid flow; modifying a level of mixing of the cooling fluid flow; modifying a flow direction of at least a part of the cooling fluid flow; modifying a presence of vortices in at least a part of the cooling fluid flow; modifying a compression level of a boundary layer of the cooling fluid flow; and modifying a momentum of at least a part of the cooling fluid flow.

One embodiment of the invention may include locating a corona electrode in the cooling fluid flow and locating a receiver electrode downstream from the corona electrode.

One embodiment of the invention may include locating a corona electrode on a first fin of a heat sink and locating a receiver electrode on a second fin of a heatsink and causing a cross cooling fluid flow.

One embodiment of the invention may include creating one or both of a cross-stream rolling vortex and a longitudinal stream-wise vortex.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A cooling apparatus comprising:
an electrostatic flow modifier to be complementarily positioned relative to a cooling fluid flow to modify at least one characteristic of the cooling fluid flow to enhance an amount of heat the cooling fluid flow removes from an electronic component, the electrostatic flow modifier including a charge source designed to charge particles in the cooling fluid flow, and a charge attractor designed to attract the charged particles; and a heat sink having at least two fins and in thermal transfer contact with the electronic component, the charge source and the charge attractor are respectively positioned on adjacent fins of a heat sink to transport warm air away from the surface of one fin and toward an other fin.

2. The cooling apparatus of claim 1 wherein the charge source is one of an ion generator and a corona electrode.

3. The cooling apparatus of claim 1 wherein the electrostatic flow modifier is designed to move some of the cooling fluid flow in a direction transverse to a direction of the cooling fluid flow.

4. The cooling apparatus of claim 1 wherein the electrostatic flow modifier is arranged to create one of a vortex in a direction of the cooling fluid flow or a vortex across the direction of the cooling fluid flow, or both.

5. The cooling apparatus of claim 1 further comprising a cooling fluid flow provider configured to provide the cooling fluid flow to cool the electronic component.

6. The cooling apparatus of claim 1 wherein the electrostatic flow modifier is designed to impart momentum and to at least partially compensate for friction losses in the cooling fluid flow.

7. The cooling apparatus of claim 1 further comprising a thermal solution in thermal transfer contact with the electronic component, and at least one other electrostatic flow modifier, the electrostatic flow modifiers positioned on a surface of the electronic component or a surface of the thermal solution.

8. The cooling apparatus of claim 1 further comprising a vapor chamber,
wherein the sink is part of a thermal solution, the cooling fluid flow providing the cooling flow to cool the thermal solution, the thermal solution further including at least one selected from the group consisting of:
a heat pipe;
a heat spreader;
a heater block; and
a thermal transfer plate.

9. The cooling apparatus of claim 1 wherein the at least one characteristic is selected from the group consisting of:
a fluid velocity profile of the cooling fluid flow;
a fluid velocity gradient of the cooling fluid flow;
a fluid velocity adjacent the electronic component;
a level of turbulence of the cooling fluid flow;
a level of mixing of the cooling fluid flow;
a flow direction of at least a part of the cooling fluid flow;
a presence of vortices in at least a part of the cooling fluid flow;
a compression level of a boundary layer of the cooling fluid flow; and
a momentum of at least a part of the cooling fluid flow.

10. A method comprising:
providing a cooling fluid flow to cool an electronic component;
modifying at least one characteristic of the cooling fluid flow by positioning an electrostatic flow modifier complementarily relative to the cooling fluid flow or the electrostatic component, or both, to enhance an amount of heat the cooling fluid flow removes from the electronic component, said positioning including locating a corona electrode on a first fin of a heatsink and locating a receiver electrode on a second fin of the heatsink and causing a modified flow across cooling fluid flow.

11. The method of claim 10 wherein the modifying at least one characteristic is selected from the group consisting of:
modifying a fluid velocity profile of the cooling fluid flow;
modifying a fluid velocity gradient of the cooling fluid flow;
modifying a fluid velocity adjacent the electronic component;
modifying a level of turbulence of the cooling fluid flow;
modifying a level of mixing of the cooling fluid flow;
modifying a flow direction of at least a part of the cooling fluid flow;
modifying a presence of vortices in at least a part of the cooling fluid flow;
modifying a compression level of a boundary layer of the cooling fluid flow; and
modifying a momentum of at least a part of the cooling fluid flow.

12. The method of claim 10 wherein said positioning includes creating one or both of a cross-stream rolling vortex and a longitudinal stream-wise vortex.

13. A system comprising:
an integrated circuit;
a cooling fluid flow provider configured to provide a cooling fluid flow to cool the integrated cirtuit;
an eletrostatic flow modifier complementarily positioned relative to the cooling fluid flow provider or the integrated circuit, or both, to modify at least one characteristic of the cooling fluid flow to enhance an amount of heat the cooling fluid flow removes from the integrated circuit, the electrostatic flow modifier including a charge source designed to charge particles in the cooling fluid flow, and a charge attractor designed to attract the charge particles;

a mass storage device coupled to the integrated circuit; and a heat sink having at least two fins and in thermal transfer contact with the integrated circuit, the charge source and the charge attractor are respectively positioned on adjacent fins of the heat sink to transport warm air away from the surface of one fin and toward an other fin.

14. The system of claim 13 wherein the charge source is one of an ion generator or a corona electrode.

15. The system of claim 13 further comprising at least one other electrostatic flow modifiers, and the plurality of the electrostatic flow modifiers being positioned on a surface of the integrated circuit or a surface of the heat sink.

16. The system of claim 13 further comprising a controller coupled to the integrated circuit to accept a temperature state, and coupled to the cooling fluid flow provider and the electrostatic flow modifier, the controller designed to effect a change in one or both of the cooling fluid flow from the cooling fluid flow provider and a charge level from the electrostatic flow modifier based on the temperature state.

17. The system of claim 13 wherein the at least one characteristic is selected from the group consisting of:
   a fluid velocity profile of the cooling fluid flow;
   a fluid velocity gradient of the cooling fluid flow;
   a fluid velocity adjacent the electronic component;
   a level of turbulence of the cooling fluid flow;
   a level of mixing of the cooling fluid flow;
   a flow direction of at least a part of the cooling fluid flow;
   a presence of vortices in at least a part of the cooling fluid flow;
   a compression level of a boundary layer of the cooling fluid flow; and
   a momentum of at least a part of the cooling fluid flow.

* * * * *

UNITED STATES PATENT AND TRADEMARK OFFICE
CERTIFICATE OF CORRECTION

PATENT NO. : 7,269,008 B2
APPLICATION NO. : 11/171682
DATED : September 11, 2007
INVENTOR(S) : Rajiv K. Mongia et al.

It is certified that error appears in the above-identified patent and that said Letters Patent is hereby corrected as shown below:

Column 7
Line 44, "...an other fin." should read --...another fin.--.

Column 9
Line 10, "...an other fin." should read --...another fin.--.

Column 8
Line 3, "The cooling apparatus of claim 1...chamber, wherein the sink is..."

should read

--...wherein the heat sink is...--.

Column 8
Line 30, "A method comprising:...

modifying...the electrostatic component,..."

should read

--modifying...the electronic component,...--.

Column 8
Line 61, "A system comprising:...

a cooling fluid...integrated cirtuit;..."

should read

--a cooling fluid...integrated circuit;...--.

UNITED STATES PATENT AND TRADEMARK OFFICE
CERTIFICATE OF CORRECTION

PATENT NO. : 7,269,008 B2
APPLICATION NO. : 11/171682
DATED : September 11, 2007
INVENTOR(S) : Rajiv K. Mongia et al.

It is certified that error appears in the above-identified patent and that said Letters Patent is hereby corrected as shown below:

Column 9
Line 3, "A system comprising:...

an electrostatic...the charge particles;..."

should read

--an electrostatic...the charged particles;...--.

Signed and Sealed this

Seventeenth Day of March, 2009

JOHN DOLL
*Acting Director of the United States Patent and Trademark Office*